(12) United States Patent
Krempel-Hesse et al.

(10) Patent No.: US 8,715,471 B2
(45) Date of Patent: May 6, 2014

(54) MAGNETRON SPUTTER CATHODE

(75) Inventors: Jörg Krempel-Hesse, Eckartsborn (DE); Andreas Jischke, Kahl (DE); Uwe Schüssler, Aschaffenburg (DE); Hans Wolf, Erlensee (DE)

(73) Assignee: Applied Materials GmbH & Co KG, Alzenau (DE)

(*) Notice: Subject to any disclaimer, the term of this patent is extended or adjusted under 35 U.S.C. 154(b) by 1052 days.

(21) Appl. No.: 11/284,439

(22) Filed: Nov. 21, 2005

(65) Prior Publication Data

US 2006/0118412 A1   Jun. 8, 2006

Related U.S. Application Data

(63) Continuation-in-part of application No. PCT/DE2004/000208, filed on Feb. 7, 2004.

(51) Int. Cl.
*C23C 14/35* (2006.01)

(52) U.S. Cl.
USPC ............ 204/298.09; 204/298.07; 204/298.12; 204/298.19; 204/298.2

(58) Field of Classification Search
USPC ............. 204/298.07, 298.09, 298.12, 298.19, 204/298.2
See application file for complete search history.

(56) References Cited

U.S. PATENT DOCUMENTS

| 5,169,509 | A |   | 12/1992 | Latz et al. |
|---|---|---|---|---|
| 5,487,822 | A | * | 1/1996 | Demaray et al. ......... 204/298.09 |
| 5,558,751 | A | * | 9/1996 | Mahler et al. ............ 204/298.26 |
| 6,093,293 | A | * | 7/2000 | Haag et al. ............... 204/298.12 |
| 6,231,726 | B1 |   | 5/2001 | Suemitsu et al. |
| 6,494,999 | B1 |   | 12/2002 | Herrera et al. |
| 6,699,374 | B2 | * | 3/2004 | Marshall .................. 204/298.14 |

FOREIGN PATENT DOCUMENTS

| DE | 41 27 260 C1 | 4/1992 |
|---|---|---|
| DE | 41 27 261 C1 | 6/1992 |
| DE | 41 27 262 C1 | 6/1992 |
| DE | 41 06 770 A1 | 9/1992 |
| DE | 195 06 513 C2 | 8/1996 |
| DE | 197 46 988 A1 | 5/1999 |
| DE | 199 47 935 A1 | 3/2001 |
| GB | 2 330 591 | 4/1999 |

(Continued)

OTHER PUBLICATIONS

Machine Translation of JP 07-331428 dated Dec. 1995.*

*Primary Examiner* — Rodney McDonald
(74) *Attorney, Agent, or Firm* — Fulbright & Jaworski LLP

(57) ABSTRACT

To be able to realize a relatively wide magnetron sputter cathode, it is proposed that on the vacuum side of a carrier (2) is disposed the sputter target (4) with a backing plate (3), which maintains a gap (14) from the carrier (2). The backing plate (3) is developed as a cooling plate. In it are located cooling means channels (15), which, via an inlet (16) through the carrier (2), are supplied with cooling fluid, which can flow out again via an outlet (17) through the carrier (2). On the atmospheric side is located a magnet configuration (5).

6 Claims, 2 Drawing Sheets

(56) References Cited

FOREIGN PATENT DOCUMENTS

| | | | |
|---|---|---|---|
| JP | 5-263224 A | 10/1993 | |
| JP | 07-331428 | * 12/1995 | |
| JP | 90-03637 A | 1/1997 | |
| JP | 90-87836 A | 3/1997 | |
| JP | 90-95782 A | 4/1997 | |
| JP | 11-350123 | 12/1999 | |
| JP | 2000-68234 A | 3/2000 | |
| JP | 2002-105634 A | 4/2002 | |
| WO | WO-9626533 | 8/1996 | |
| WO | WO-99/31290 | 6/1999 | |

* cited by examiner

MAGNETRON SPUTTER CATHODE

This is a continuation-in-part of PCT/DE2004/000208 filed Feb. 7, 2004, which claims priority from German Patent Application No: 103 23 258.3 filed May 23, 2003, each of which is incorporated herein by reference.

BACKGROUND AND SUMMARY OF THE INVENTION

The invention relates to a magnetron sputter cathode with a closure element, which can be set into an opening of the housing wall of a vacuum chamber, whereby the opening is closed airtight and the closure element is electrically insulated against the housing wall, with a sputter target on the vacuum side of the closure element, with a magnet configuration on its atmospheric side, and with a cooling plate operated with a cooling fluid for the sputter target and with the further characteristics of claim 1.

A cathode with the characteristics explicitly listed above is described inter alia in U.S. Pat. No. 5,458,759.

In the implementation described in this document the closure element consists of the backing plate of the sputter target provided with a frame, which makes it possible to set the backing plate airtight into an opening of the housing wall of the vacuum chamber, such that the sputter target connected with the backing plate is located in the vacuum chamber. On the atmospheric side of the backing plate there is a cooling plate with open channels which are closed off by the backing plate. Behind it is located a movable magnet configuration whose magnetic field extends to the region in front of the sputter target.

Electrons emitted from the cathode are accelerated by a high voltage applied to the cathode and ionize the gas molecules of a working gas in the vacuum chamber. The positively charged ions generated therein impinge on the sputter target and knock out molecules and atoms, which are deposited in thin layers onto a substrate. The electrons are concentrated in front of the sputter target by the magnetic field such that the ion yield is increased. According to the magnetic field geometry, so-called race tracks form in the sputter target. In order to ensure uniform erosion of the material, the magnet configuration can be shifted.

The arrangement described in U.S. Pat. No. 5,458,759 is only suitable for small sputter targets which have a short useful life. To extend the useful life, widening the sputter target could be considered or disposing several targets adjacent to one another on the closure element. However, the following must be taken into account: the backing plate serving as closure element is exposed to the differential pressure between vacuum and atmosphere and therefore would be deflected at too large a lateral extent. As a consequence, this, in turn, would result in the sputter target, comprising a brittle material, separating from the backing plate or forming cracks. The channels of the cooling plate conducting the cooling water could also no longer be sealed tightly enough by the backing plate. The durability of such an enlarged cathode is therefore not very great. While it would be conceivable to implement the backing plate to be thicker and therewith more stable, this would, however, result in a reduced cooling effect for the sputter target. In addition, the problem would be created that, due to the greater distance from the magnet configuration, the magnetic field in front of the target would be weaker and consequently the ion yield lower.

Therewith the problem needs to be solved of providing a magnetron sputter cathode which, compared to previously known solutions, has a markedly increased useful life.

According to U.S. Pat. No. 6,494,999 B1 the cooling plate is disposed on the vacuum side between the closure element implemented as a carrier and the sputter target.

This realization has the advantage that the cooling plate is located within the vacuum and therewith is closer to the target, whereby the cooling efficiency is improved. The carrier itself is a separate structural element, which can be realized such that it can absorb and brace against the acting pressures without experiencing significant deflection. Since the cooling means in this implementation is located within the vacuum chamber, the carrier requires lead-throughs for the cooling fluid.

Such a disposition permits a significantly wider implementation of the cathode, since the carrier is no longer formed by the backing plate, but rather forms a separate structural element, which can be laid out according to the obtaining pressure loading.

The carrier according to U.S. Pat. No. 6,494,999 B1 includes through-conduits for the cooling fluid.

Since the cooling plate is thus not loaded by differential pressure, the cooling plate can be provided with cooling channels and can simultaneously form the backing plate of the sputter target. The cooling channels within the cooling plate have a closed cross section, such that the one side of the backing plate forms a continuous contact face toward the sputter target. This simplifies establishing the bond between the sputter target and the backing plate implemented as cooling plate.

In order for the requirements made of the resistance to deformation of the carrier under pressure loading not to be too high, it is proposed that spacers are provided between the backing plate and the carrier, such that a gap remains between the central region of the backing plate and the carrier.

The problem addressed by the invention, consequently, comprises providing a secure seating for a backing plate to be implemented as thin as possible.

According to the invention the spacers are formed by webs (13), on which the margin of the backing plate (3) is fastened in contact, with its side facing away from the sputter target, such that when the vacuum chamber is evacuated, the gap is also evacuated, and that the gap permits the deflection of the carrier, since the backing plate, and therewith the sputter target, are free of pressure differential.

If during the fastening of the backing plate on the carrier plate a lateral tolerance at the webs is specified, the backing plate is not forced to follow a deflection of the carrier along. The backing plate remains straight and there is no risk of the sputter target detaching from the backing plate.

In the simplest case the spacers are formed integrally with the carrier, the conduction of the cooling fluid taking place through the webs.

This also permits, inter alia, the supply to the channels in the backing plate to take place via the fastening of the backing plate on the webs.

In order for the carrier itself not to become too thick, whereby the magnets would have to be disposed at too great a distance from the sputter target, it is furthermore proposed that the carrier on the atmospheric side has at least on its longitudinal sides two marginal reinforcement ribs. These can simultaneously serve for the purpose of fitting the carrier into the opening. It is understood, that an encompassing reinforcement rib could also be provided such that the carrier assumes a tub-form shape.

In the case in which the cathode is implemented to be wider, it can additionally be provided that not a unitary sputter target is provided, but rather that on the carrier are disposed at least two elongated sputter targets adjacent to one another, each with a backing plate, with one magnet configuration generating a race track being assigned to each sputter target.

The disposition of several sputter targets also has the advantage that the individual sputter targets do not become excessively heavy and consequently remain manageable.

However, individual elongated sputter targets could also become very heavy. It is therefore proposed that each sputter target is composed of several sputter target segments abutting one another. Moreover, to each sputter target segment its own backing plate is assigned, which, for this purpose, is also segmented. Each individual segment comprises its own cooling water circulation with its own cooling water supply. In principle, segmentation can also be carried out if the backing plate is the closure element itself.

Such a configuration has also the advantage that the cooling circulations do not become too long, such that even at the end of the circulation the cooling water is still sufficiently cool and has adequate cooling capacity, such that the target has a uniform temperature overall.

For clarification, the invention will be explained in the following in further detail in conjunction with an embodiment example. In the drawing depict:

DETAILED DESCRIPTION

Figure 1:
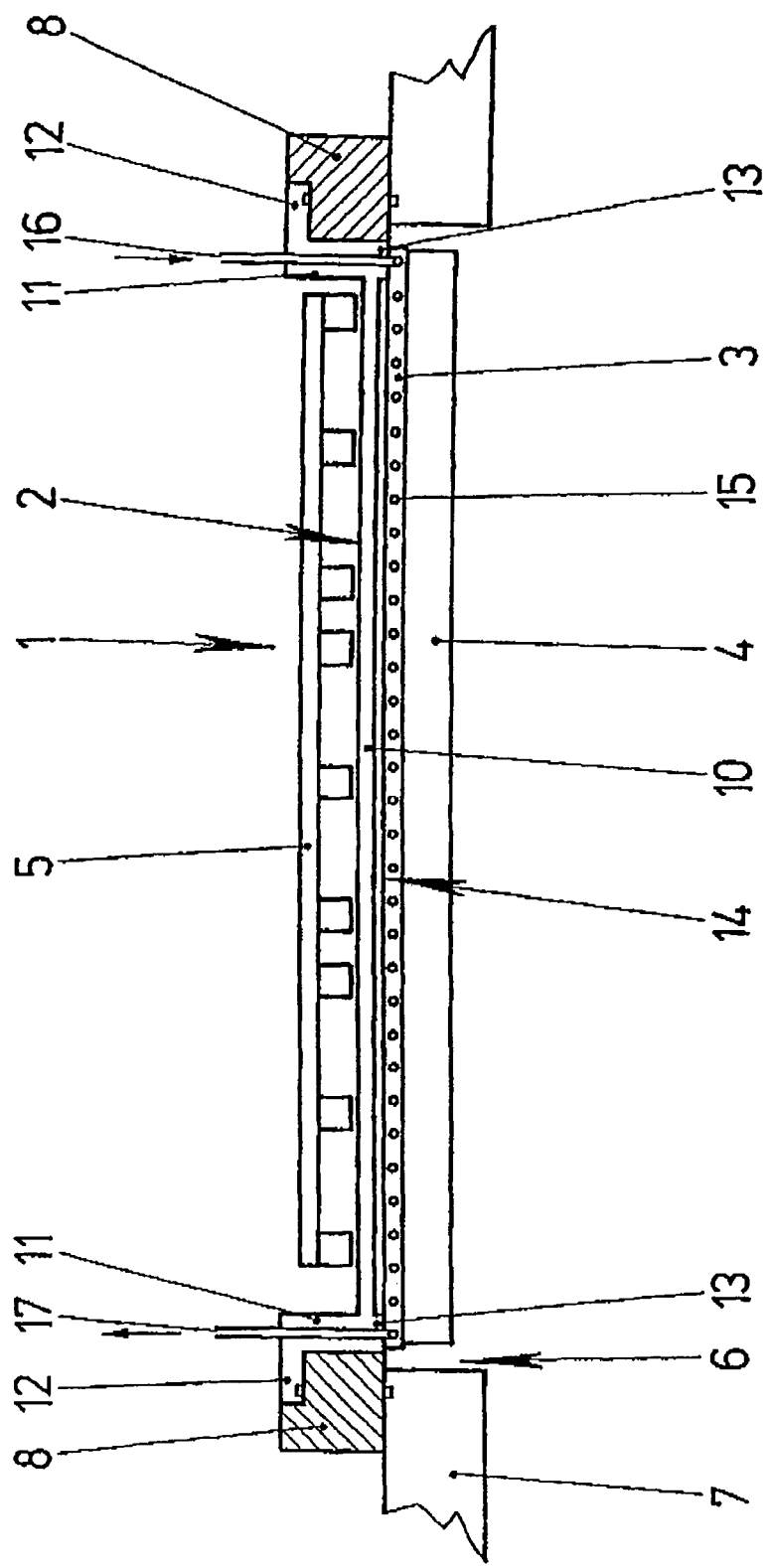
FIG. 1 a schematic diagram of a magnetron sputter cathode according to the invention in section, and FIG. 2 a perspective representation of a backing plate composed of several segments.

The sputter cathode 1 comprises a carrier 2, at the vacuum side of which is provided, first, a backing plate 3 developed as a cooling plate for a sputter target 4. At the atmospheric side is located a magnet configuration 5, which can be moved back and forth parallel to the sputter target 4 through a (not further shown) displacement system.

The backing plate 3 is set under a seal into an opening 6 in the housing wall 7 of a vacuum vessel. For this purpose is provided an insulator 8, which, on the one hand, electrically insulates the carrier 2 against the housing wall 7, and, simultaneously, ensures that the connection is airtight.

The carrier 2 is comprised of a plate 10 with an encompassing reinforcement rib 11, which includes an outwardly offset flange 12. Between this flange 12 and the housing wall 7 is located the insulator 8, which is contact on the outside of the reinforcement rib 11. Toward the vacuum side the reinforcement ribs 11 are extended into webs 13, on which is seated the backing plate 3, such that between the plate 10 of the carrier 2 and the backing plate 3 a gap 14 is formed. When the chamber is evacuated, this gap is also evacuated, such that the backing plate 3, and therewith the sputter target 4, are free of pressure differential.

In the backing plate 3 are located cooling channels 15, which, via an inlet 16, are supplied with cooling fluid, which is lead back via an outlet 17. The inlet 16 and the outlet 17 are carried through the reinforcement ribs 11 and the web 13.

As previously described, such a configuration has the advantage that the carrier 2 can be laid out to the effect that it is capable of maintaining the atmospheric pressure obtaining when the chamber is evacuated, while the sputter target 4 and the backing plate 3 itself are not exposed to any differential pressure.

The gap 14 even permits a slight deflection of the carrier 2 without this deflection having a negative effect on the sputter target 4.

The stability of the carrier 2 is generated in particular through the reinforcement rib 11, such that its plate 10 itself does not need to be very thick, and therefore the magnets of the magnet configuration 5 can be disposed in relatively close proximity to the sputter target 4.

Figure 2:
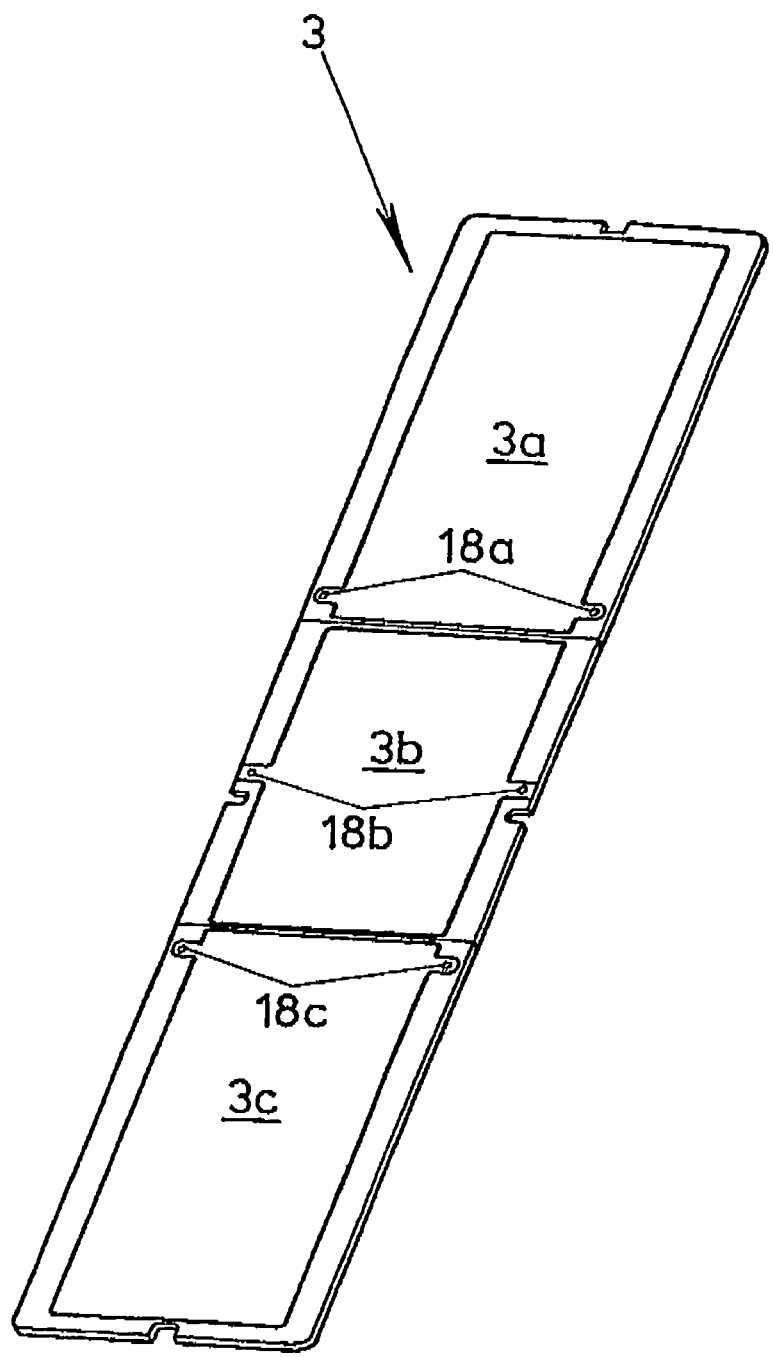

As FIG. 2 shows, the backing plate 3 can be composed of several segments 3a, 3b, 3c. This is recommended in particular if the target as a whole is to have a relatively large longitudinal dimension. The carrier 2 furthermore is comprised of a continuous plate 10 with longitudinally extending reinforcement ribs 11 and webs 13. The individual segments 3a, 3b, 3c of the backing plate 3, viewed in the longitudinal direction of carrier 2, are set next to one another and span it (the carrier) from one to the opposite web 13. Each segment 3a, 3b, 3c, is fastened individually on the carrier 2 and has its own cooling water circulation with its own connection 18a, 18b, 18c, to the inlet and outlet 16, 17 on the carrier 2.

LIST OF REFERENCE NUMBERS

1 Magnetron sputter cathode
2 Carrier
3 Backing plate (a, b, c: segments)
4 Sputter target
5 Magnet configuration
6 Opening
7 Housing
8 Insulator
9
10 Carrier plate
11 Reinforcement ribs
12 Flange
13 Web
14 Gap
15 Channels
16 Inlet
17 Outlet
18 Connection It is claimed:
1. A magnetron sputter cathode comprising:
a closure element having a carrier and a cooling plate, wherein the closure element can be set into an opening of a housing wall of a vacuum chamber, whereby the opening is closed airtight and the closure element is electrically insulated against the housing wall;
a sputter target at the vacuum side of the closure element;
a magnet configuration, which can be moved back and forth parallel to the sputter target, at its atmospheric side; and
wherein the cooling plate is operable with a cooling fluid for the sputter target;
wherein the cooling plate is provided with cooling channels disposed on the vacuum side of the closure element, wherein the cooling plate forms the backing plate of the sputter target, wherein the carrier comprises through-conduits for cooling fluid and cooling channels within the cooling plate having a closed cross section, such that there is a continuous contact face to the sputter target;
wherein spacers are provided between the cooling plate and the carrier such that between a central region of the cooling plate and the carrier a gap remains,
wherein the spacers are formed by webs, on which the margin of the cooling plate, with its side facing away from the sputter target is fastened in contact, such that with the vacuum chamber evacuated, the gap is also evacuated, wherein the gap permits a deflection of the carrier since the backing plate, and therewith the sputter target, are free of pressure, wherein the carrier has two marginal reinforcement ribs that are extended toward the vacuum side into the webs, and wherein the through-conduits are carried through the reinforcement ribs and the webs.

2. The magnetron sputter cathode of claim 1, wherein the conduction of the cooling fluid takes place through the webs formed integrally with the carrier.

3. The magnetron sputter cathode of claim 1, wherein the two marginal reinforcement ribs are at the atmospheric side.

4. The magnetron sputter cathode of claim 3, wherein at least two elongated sputter targets each with one backing plate are disposed adjacent to one another on the carrier, and to each sputter target a magnet configuration generating a race track is assigned.

5. The magnetron sputter cathode of claim 1, wherein each sputter target is composed of several sputter target segments abutting one another.

6. The magnetron sputter cathode of claim 5, wherein one individual backing plate is assigned to each sputter target segment which has its own cooling water supply.

* * * * *